United States Patent
Tzeng

(10) Patent No.: US 8,683,649 B2
(45) Date of Patent: Apr. 1, 2014

(54) AUTOMATICALLY CLOSING HINGE AND ELECTRONIC DEVICE USING SUCH HINGE

(71) Applicant: Avision Inc., Hsinchu (TW)

(72) Inventor: Chih-Chin Tzeng, Hsinchu (TW)

(73) Assignee: Avision Inc. (TW)

( * ) Notice: Subject to any disclaimer, the term of this patent is extended or adjusted under 35 U.S.C. 154(b) by 0 days.

(21) Appl. No.: 13/670,116

(22) Filed: Nov. 6, 2012

(65) Prior Publication Data

US 2013/0119842 A1 May 16, 2013

(30) Foreign Application Priority Data

Nov. 14, 2011 (TW) .............................. 100141374 A

(51) Int. Cl.
*E05F 1/08* (2006.01)

(52) U.S. Cl.
USPC ................ 16/50; 16/72; 16/DIG. 10; 16/285; 16/295; 399/380

(58) Field of Classification Search
USPC ........... 16/341, 342, 337, 386, 50, 65, 72, 76, 16/85, 285, 295, DIG. 10; 361/679.27; 399/380
See application file for complete search history.

(56) References Cited

U.S. PATENT DOCUMENTS

| | | | | |
|---|---|---|---|---|
| 4,030,161 A * | 6/1977 | Loikitz | ............................ | 16/284 |
| 4,701,978 A * | 10/1987 | Selmer | ............................ | 16/380 |
| 5,138,743 A * | 8/1992 | Hoffman | ............................ | 16/303 |
| 5,333,356 A * | 8/1994 | Katagiri | ............................ | 16/340 |
| 5,715,576 A * | 2/1998 | Liu | ............................ | 16/342 |
| 5,799,371 A * | 9/1998 | Lin | ............................ | 16/330 |
| 5,966,776 A * | 10/1999 | Ona | ............................ | 16/328 |
| 6,308,377 B1 * | 10/2001 | Maatta | ............................ | 16/341 |
| 6,381,808 B1 * | 5/2002 | Kida | ............................ | 16/340 |
| 6,634,061 B1 * | 10/2003 | Maynard | ............................ | 16/342 |
| 6,684,456 B2 * | 2/2004 | Lee | ............................ | 16/342 |
| 7,406,747 B2 * | 8/2008 | Chol | ............................ | 16/239 |
| 7,512,376 B2 * | 3/2009 | Suzuki | ............................ | 399/380 |
| 7,900,320 B2 * | 3/2011 | Katsumata et al. | ............. | 16/286 |
| 8,020,256 B2 * | 9/2011 | Goller et al. | .................... | 16/342 |
| 8,024,841 B2 * | 9/2011 | Shen | ............................ | 16/341 |
| 8,468,654 B2 * | 6/2013 | Zhang et al. | .................... | 16/342 |
| 2007/0240282 A1 * | 10/2007 | Nishida | ............................ | 16/223 |
| 2013/0205540 A1 * | 8/2013 | Kim | ............................ | 16/65 |

* cited by examiner

*Primary Examiner* — William Miller

(57) ABSTRACT

In an automatically closing hinge, a first body and a second body are mounted on a fixed shaft, and axial and radial moving members are adjacently disposed inside the fixed shaft. The second body pivoting rearward in relation to the first body enables an inward radial movement of the radial moving member, and during the inward radial movement the radial moving member causes a forward axial movement of the axial moving member. An energy storing member in the fixed shaft is configured to store energy during the forward axial movement of the axial moving member and to release energy for driving the axial moving member to make a reverse axial movement. During the reverse axial movement the axial moving member pushes the radial moving member to make an outward radial movement. The radial moving member during such outward radial movement drives the second body to pivot forward.

20 Claims, 11 Drawing Sheets

AUTOMATICALLY CLOSING HINGE AND ELECTRONIC DEVICE USING SUCH HINGE

This application claims priority of No. 100141374 filed in Taiwan R.O.C. on Nov. 14, 2011 under 35 USC 119, the entire content of which is hereby incorporated by reference.

BACKGROUND OF THE INVENTION

1. Field of the Invention

The present invention relates to an automatically closing hinge and an electronic device using the hinge, and more particularly to a hinge using an inclined-surface slider mechanism and a torque limiter to achieve the automatically closing function and to allow the components attached to the hinge to remain stationary, and an electronic device using the hinge.

2. Related Art

Hinges are common mechanical components used in electronic devices, such as mobile phones, flatbed scanners, office machines, and etc. Two hinges can connect a base to a cover of the electronic device. In the scanner, for example, the user can open the cover, place a document and close the cover to press the document, so that the document can be scanned. More particularly, when the cover of the scanner is equipped with a sheet-feeding mechanism, the overall weight of the cover is increased due to the presence of the sheet-feeding mechanism. In order to prevent the cover from suddenly closing up by its own weight, the used hinges are usually configured to open up and remain stationary at a predefined angle, such that the user can conveniently place the document on the platen. This type of hinge usually contains multiple sets of friction plates in conjunction with a spring providing a lateral force to fix the angle of the cover by way of friction. In another type of hinge, a torsion spring is utilized and the torque of the torsion spring is restricted to achieve the object of fixing the hinge at the predefined angle. However, these hinges encounter the problem that the friction plates need to be manufactured by steel sheets, and the cost is increased. In addition, the friction caused by utilizing the spring to exert the force to the friction plate cannot be adjusted easily and neither can be controlled, due to the attenuation of the elasticity of the spring.

In addition, the hinge is also configured to automatically close the cover when an angle is reached in order to avoid problems arising out of the cover not properly closed. This hinge with the automatically closing function is typically based on the property of interference deformation of a plastic member. When the cover is pushed downward to a position of a predefined angle, the energy of the deformed plastic member is released to provide a downward force and to automatically close the cover. In such a hinge, the angle at which the cover is automatically closed cannot be easily and precisely controlled, and the lifetime of the plastic member is shortened because the plastic member is continuously in the deformed state.

SUMMARY OF THE INVENTION

Accordingly, the present invention has been proposed to solve the problems of the prior art, and it is an object of the present invention to provide a hinge utilizing an inclined-surface slider mechanism and a torque limiter to achieve the automatically closing function and allow the components attached to the hinge to remain stationary, and an electronic device using the hinge.

To achieve the above-identified object, the present invention provides an automatically closing hinge including a fixed shaft, a first body, a second body, an axial moving member, a radial moving member and an energy storing member. The first body is mounted on the fixed shaft. The second body pivotable with respect to the first body includes a rotary sleeve, which is rotatably mounted on the fixed shaft and has a receiving cavity. The axial moving member is disposed inside the fixed shaft and movable in an axial direction of the fixed shaft. The radial moving member is disposed adjacent to the axial moving member inside the fixed shaft and movable in a radial direction of the fixed shaft. The second body pivoting rearward in relation to the first body enables an inward radial movement of the radial moving member, and during the inward radial movement the radial moving member pushes the axial moving member and causes a forward axial movement of the axial moving member. The energy storing member is disposed in the fixed shaft and configured to store energy during the forward axial movement of the axial moving member and to release energy for driving a reverse axial movement of the axial moving member. During the reverse axial movement the axial moving member pushes the radial moving member to make an outward radial movement. The radial moving member during the outward radial movement drives the second body to pivot forward.

In addition, the hinge may further comprise a torque limiter which is sleeved on the fixed shaft, combined with the rotary sleeve and rotated with the rotary sleeve. When a pivot angle of the second body in relation to the first body is larger than a predefined angle, the torque limiter provides torque to maintain the second body at the pivot angle.

The present invention also provides an electronic device including a base, a cover and the hinge. The cover is rotatably connected to the base. The hinge rotatably connects the cover to the base.

In the present invention, the hinge and the electronic device require no friction plate, so that the cost can be reduced and the angle of the second body in relation to the first body can be effectively and precisely controlled. Because the torque limiters can provide several specifications of torque and can precisely control the orientation of the second body of the hinge, the designer can choose the torque limiter according to the product specification in a modularized manner, and the application of the hinge becomes more versatile. In addition, utilizing the inclined-surface slider mechanism composed of the axial moving member and the radial moving member in conjunction with the energy storing member makes the hinge have the automatically closing function. Also, the starting angle of automatically closing the cover can be changed by simply changing the angle of the inclined outer surface and the movement stroke of the radial moving member.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

DETAILED DESCRIPTION OF THE INVENTION

The present invention will be apparent from the following detailed description, which proceeds with reference to the accompanying drawings.

Figure 1:
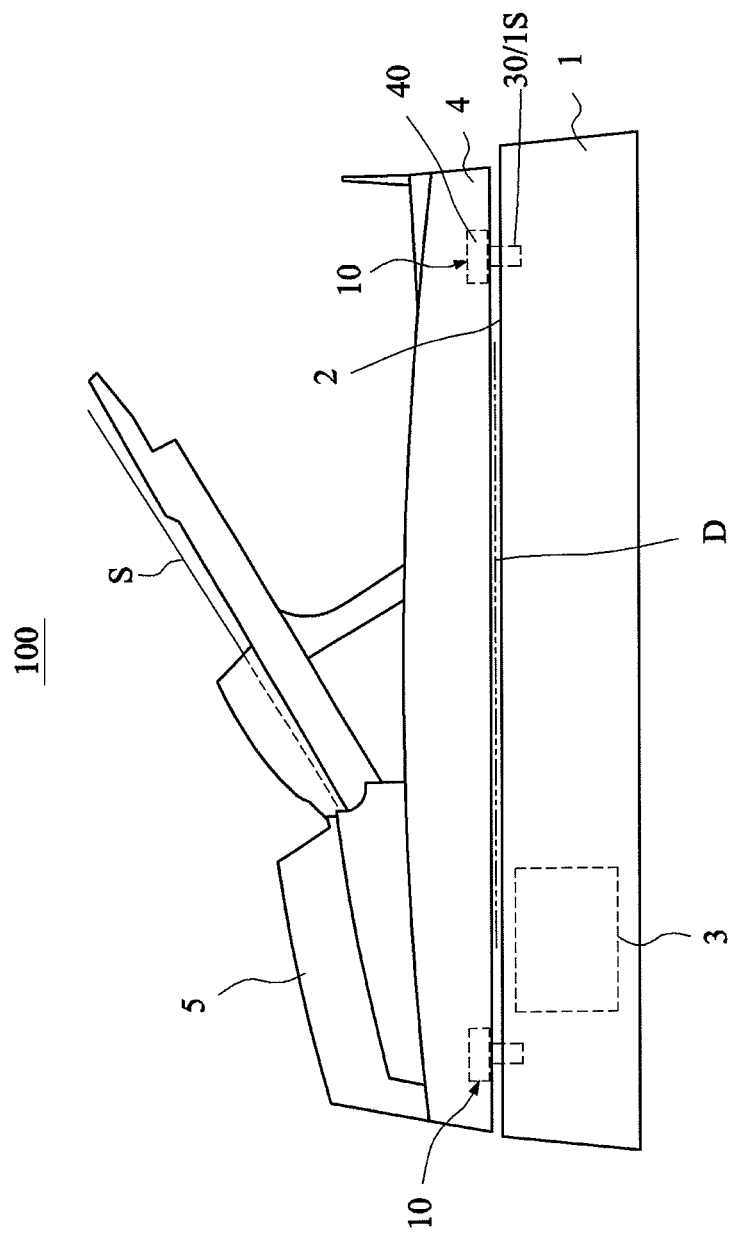
FIG. 1 is a schematic illustration of an electronic device according to an embodiment of the present invention.

FIG. 1 is a schematic illustration of an electronic device according to an embodiment of the present invention. Referring to FIG. 1, the electronic device, for example, is a scanning apparatus 100 including a base 1, a scanning module 3, a cover 4 and two hinges 10. The base 1 has a platen 2. The scanning module 3, disposed in the base 1, scans a document D placed on the platen 2. The cover 4 mounted on top of the base 1 is used for pressing the document D on the platen 2. The hinge 10 pivotally connects the cover 4 and the base 1. If the electronic device is not a scanning apparatus, the platen 2 and the scanning module 3 may be omitted.

The hinge 10 includes a first body 30 and a second body 40. In this embodiment, the cover 4 is fixed to the second body 40, and the first body 30 is mounted in the base 1 (more particularly, movably disposed on the base 1) to allow the cover 4 to press documents D of different thicknesses. The first body 30 may be inserted into a slot 1S of the base 1 and can be advantageously moved up and down. A sheet feeder 5, disposed on the cover 4, transports a sheet S to be scanned by the scanning module 3. In this embodiment, the hinge 10 provides the effects of automatically closing the cover 4 and allows the cover 4 to remain stationary. The automatically closing angle in this specification represents the included angle between the cover 4 and the base 1. When the included angle of the cover 4 in relation to the base 1 is smaller than or equal to the automatically closing angle, the cover 4 automatically closes. When the included angle between the cover 4 and the base 1 is larger than the automatically closing angle, the cover 4 stays at the position corresponding to this included angle and remains stationary.

Figure 2:
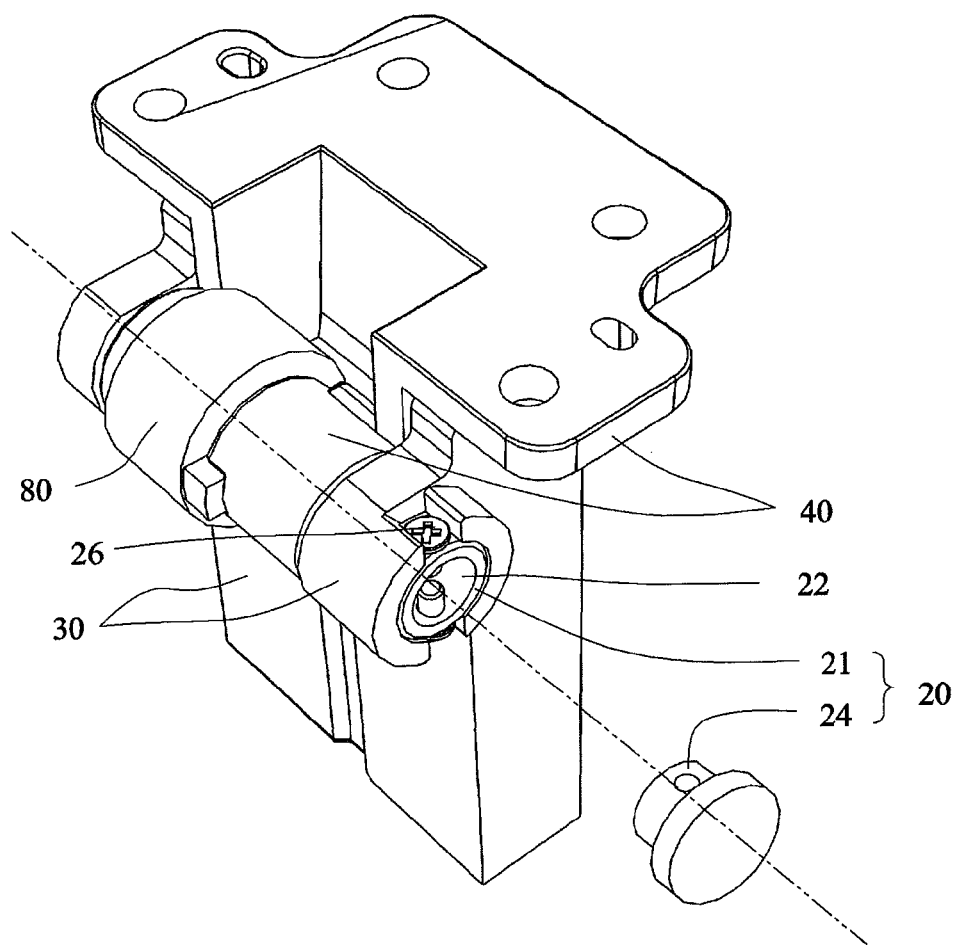
FIG. 2 is a pictorial view of a hinge according to the embodiment of the present invention.

FIG. 2 is a pictorial view of the hinge 10 according to the embodiment of the present invention. Referring to FIG. 2, in addition to the first body 30 and the second body 40, the hinge 10 also includes a fixed shaft 20 and a torque limiter 80. The fixed shaft 20 includes a shaft body 21 and a fixer 24. A screw 26 passing through the shaft body 21 fixes the fixer 24 to the shaft body 21.

Figure 3:
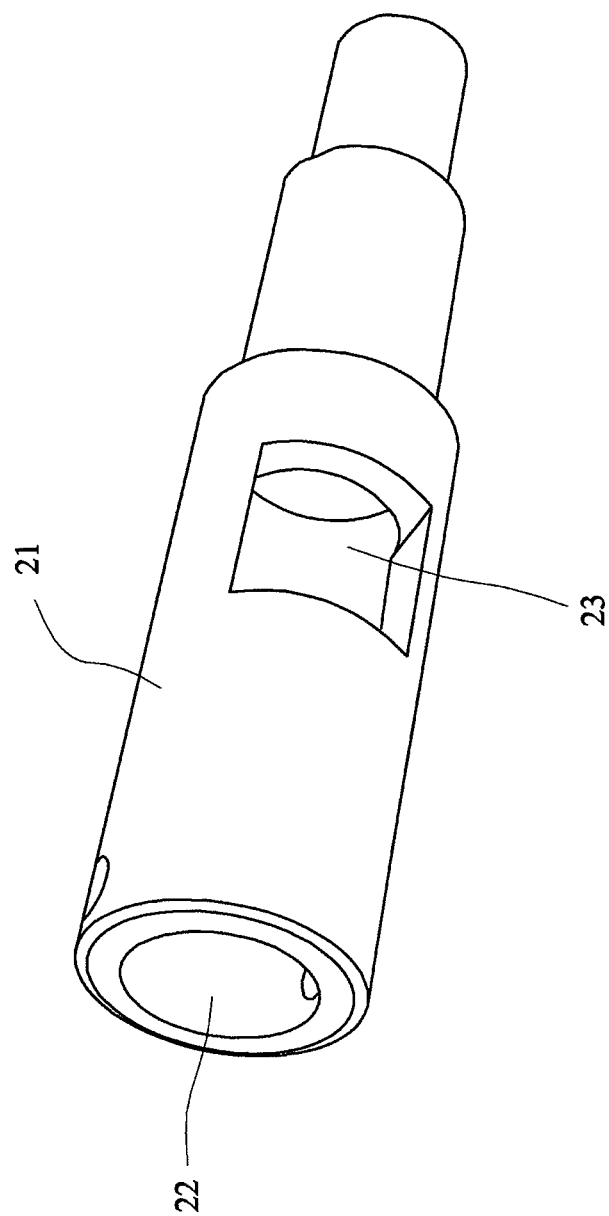
FIG. 3 is a pictorial view of a shaft body of the fixed shaft of FIG. 2.

FIG. 3 is a pictorial view of the shaft body 21 of the fixed shaft 20 of FIG. 2. Referring to FIGS. 2 and 3, the shaft body 21 has a chamber 22 and an opening 23 interconnecting with each other.

Figure 4:
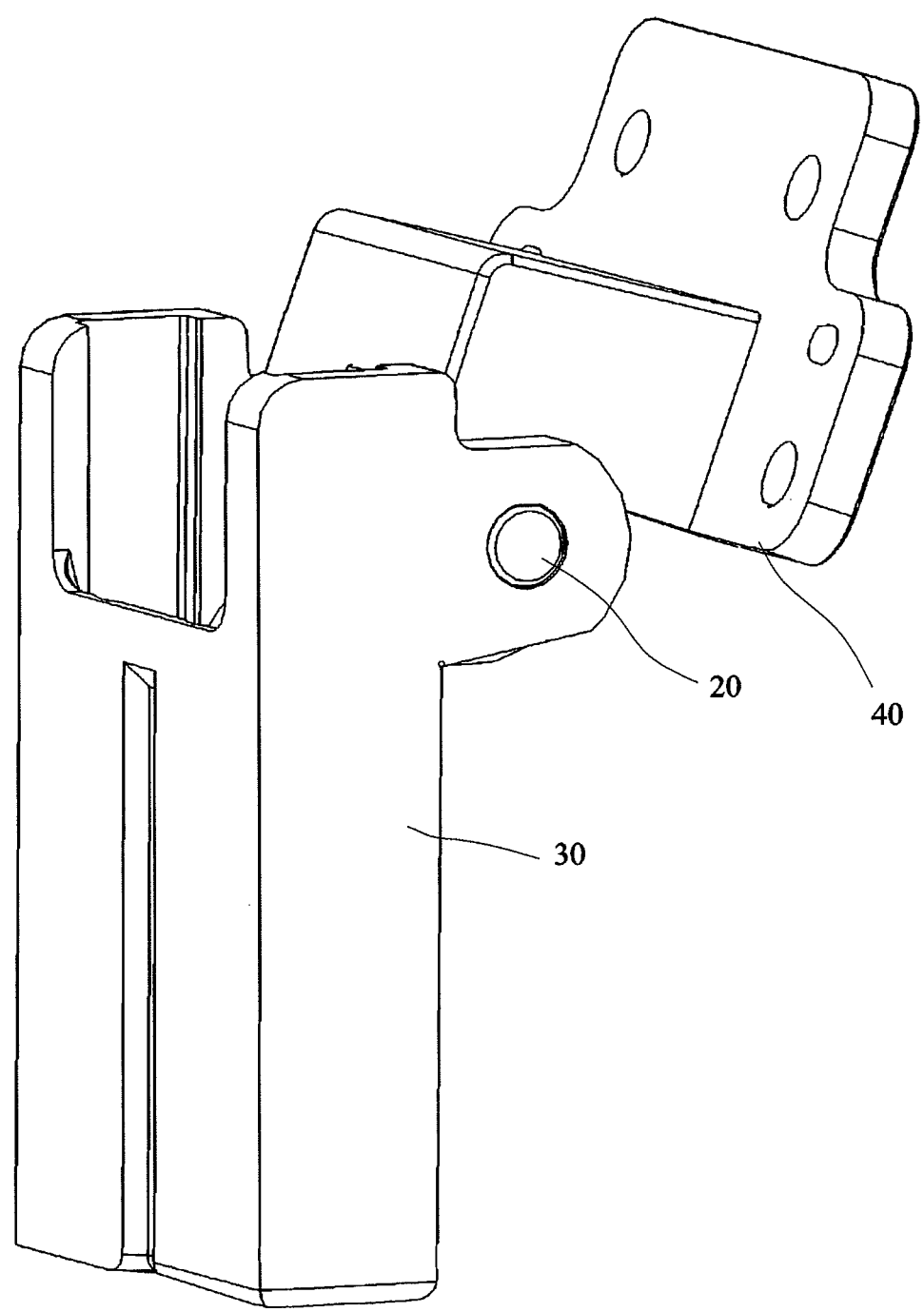
FIG. 4 is a pictorial view of the hinge of FIG. 2 when the cover is in an open state.
Figure 5:
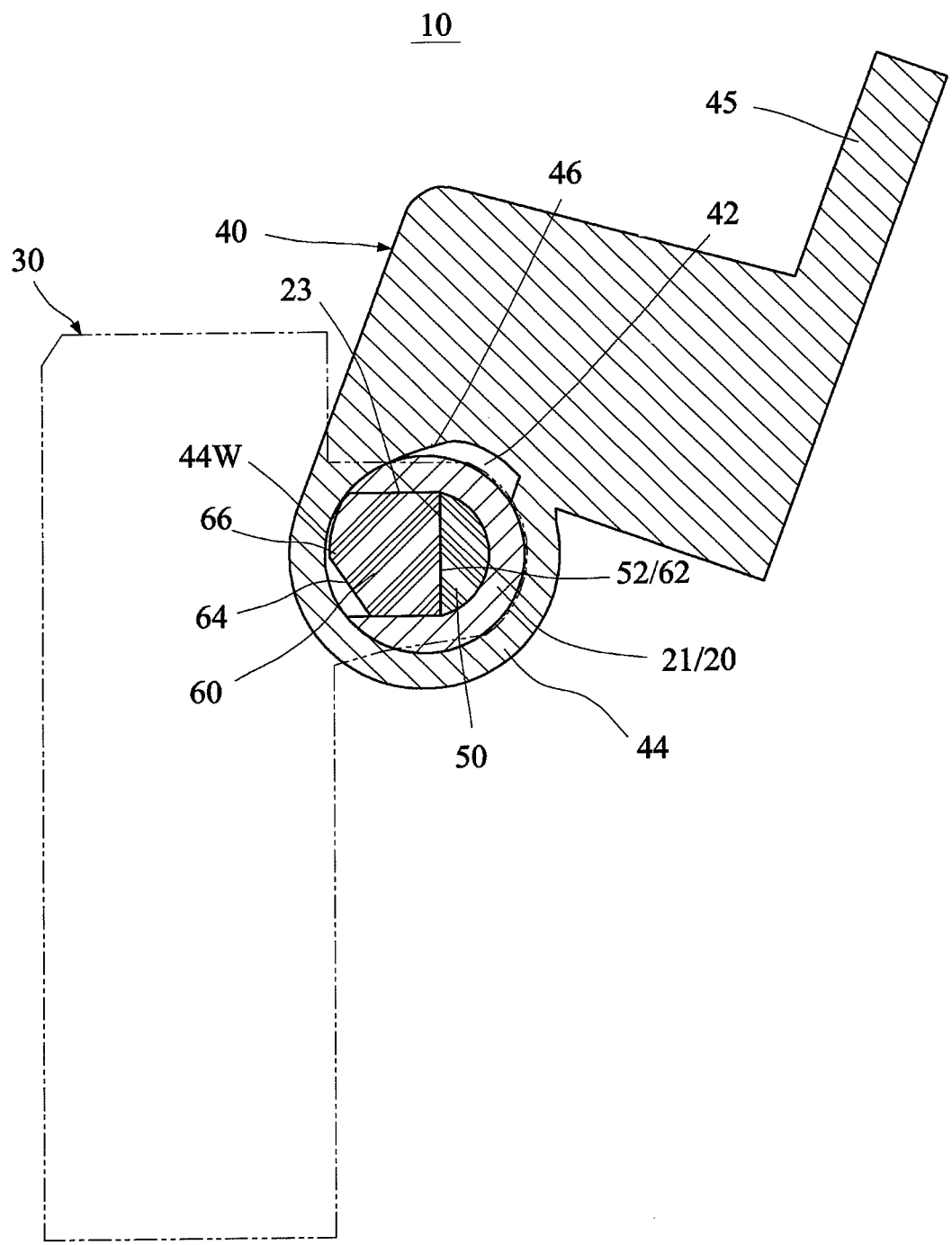
FIG. 5 is a schematic illustration of the hinge of FIG. 2 when the cover is in the open state.
Figure 6:
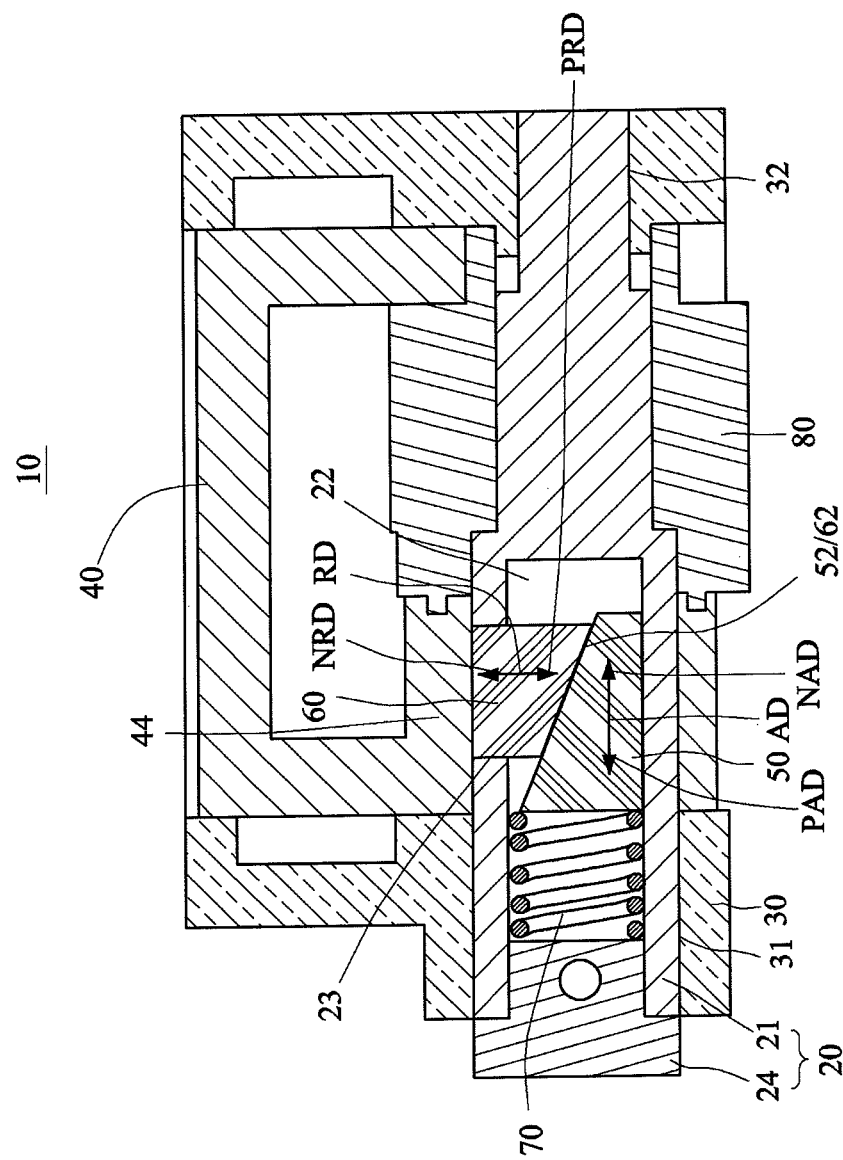
FIG. 6 is a partial cross-sectional view of the hinge of FIG. 2 when the cover is in the open state.

FIG. 4 is a pictorial view of the hinge 10 of FIG. 2 when the cover 4 is in an open state. FIG. 5 is a schematic illustration of the hinge 10 of FIG. 2 when the cover 4 is in the open state. FIG. 6 is a partial cross-sectional view of the hinge 10 of FIG. 2 when the cover 4 is in the open state. Referring to FIGS. 2 to 6, the hinge 10 includes the first body 30, the second body 40, the fixed shaft 20 and the torque limiter 80, and further includes an axial moving member 50, a radial moving member 60 and an energy storing member 70. The first body 30 is mounted on the fixed shaft 20. The second body 40 is pivotable with respect to the first body 30. The second body 40 includes a rotary sleeve 44, which is rotatably mounted on the fixed shaft 20 and has a receiving cavity 42. The second body 40 has a cover mounting seat 45, on which the cover 4 of FIG. 1 is mounted (see FIGS. 7 and 9). The fixed shaft 20 is inserted into the first body 30 through a first open end 31 and a second open end 32 of the first body 30. The axial moving member 50, the radial moving member 60 and the energy storing member 70 are disposed in the chamber 22. The radial moving member 60 may project from and retract into the chamber 22 through the opening 23.

The axial moving member 50 is movable in an axial direction AD of the fixed shaft 20. The radial moving member 60 is disposed adjacent to the axial moving member 50 and movable in a radial direction RD of the fixed shaft 20. The axial moving member 50 has a first inclined surface 52, and the radial moving member 60 has a second inclined surface 62. The second inclined surface 62 and the first inclined surface 52 tightly resting against each other and are slidable relatively to each other. The axial moving member 50 and the radial moving member 60 push each other through the adjacently disposed first inclined surface 52 and second inclined surface 62. This mechanism of converting the axial (radial) movement into the radial (axial) movement through the relative movement of the inclined surfaces is referred to as the inclined-surface slider mechanism.

Figure 10:
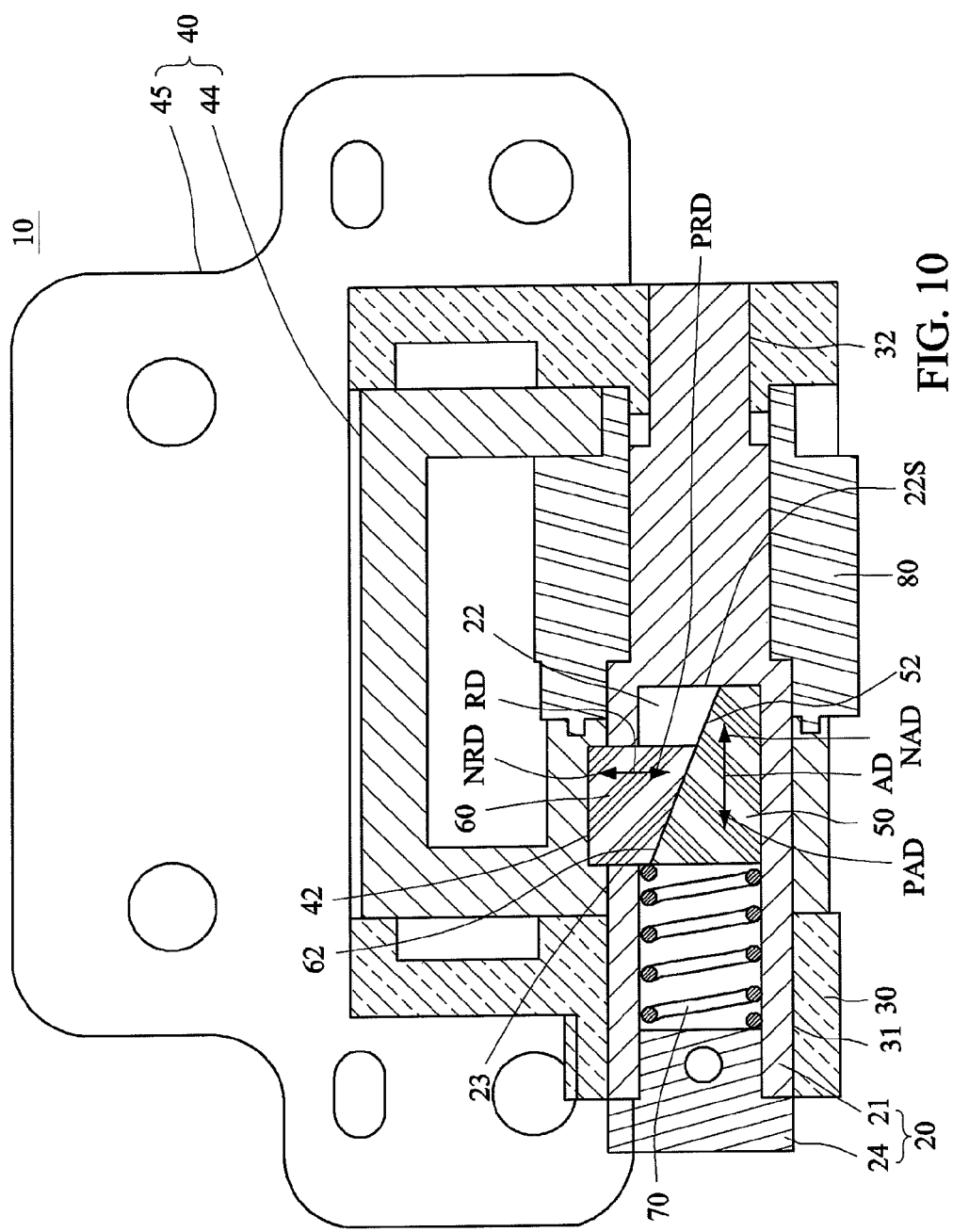
FIG. 10 is a partial cross-sectional view of the hinge of FIG. 2 when the cover is in the closed state.

The energy storing member 70 provides power to the inclined-surface slider mechanism to accomplish the automatically closing function. The energy storing member 70 is configured to store energy when the user lifts up the cover 4. As shown in FIGS. 4 to 6, when the cover 4 is lifted away from the platen 2, the second body 40 pivots rearward in relation to the first body 30 and enables an inward radial movement PRD of the radial moving member 60. During the inward radial movement PRD, the radial moving member 60 pushes the axial moving member 50 and causes a forward axial movement PAD of the axial moving member 50. The energy storing member 70, disposed in the fixed shaft 20, stores energy during the forward axial movement PAD of the axial moving member 50. In this embodiment, the energy storing member 70 includes a spring. The spring in FIG. 6 is in a compressed state, and the spring in FIG. 10 is in a loosen state. In another embodiment, the energy storing member 70 may be a member (e.g., another elastic member or magnetic member) capable of storing energy.

Figure 7:
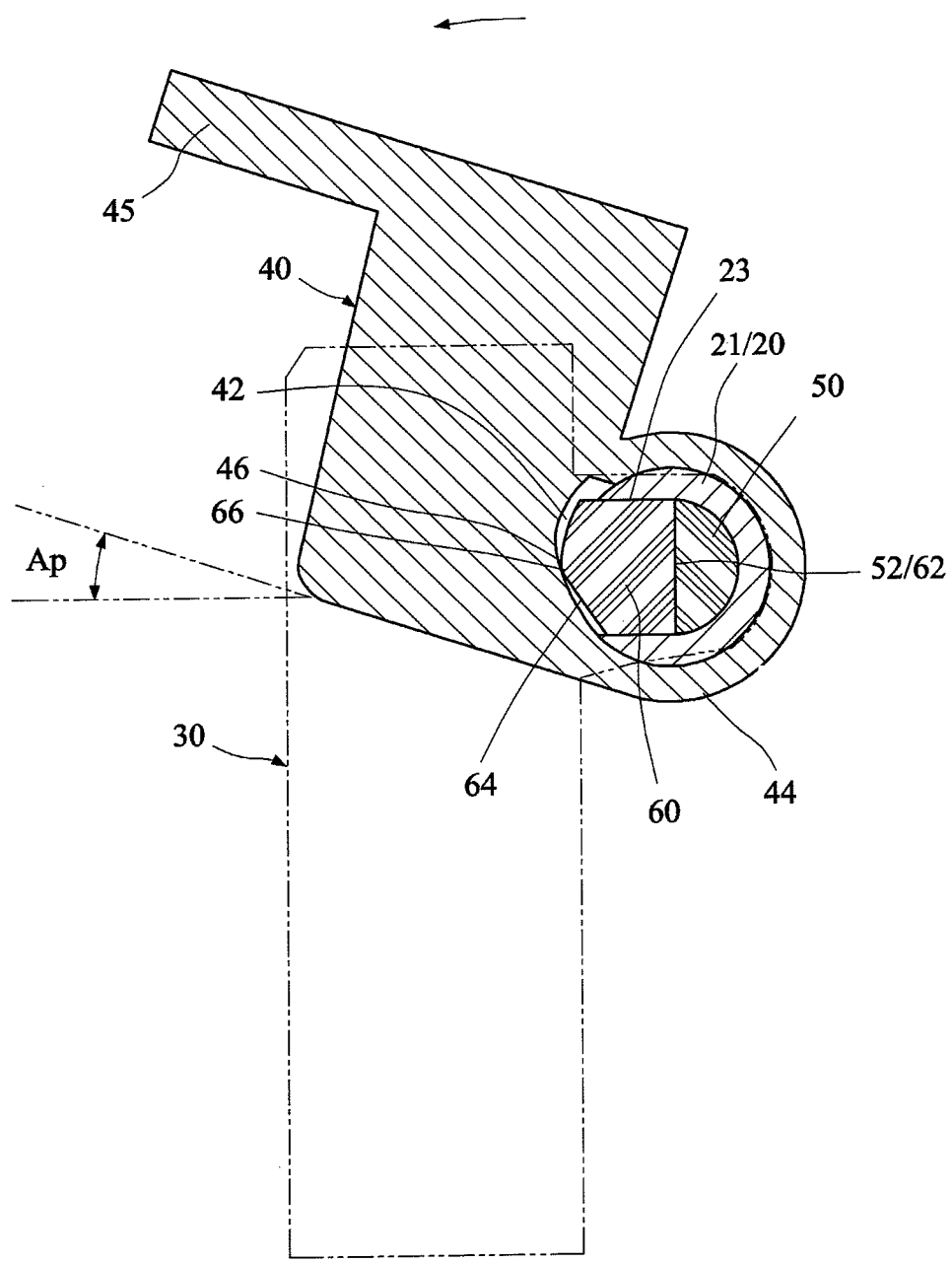
FIG. 7 is a schematic illustration of the hinge of FIG. 2 when the cover is ready to enter the automatically closing state.
Figure 8:
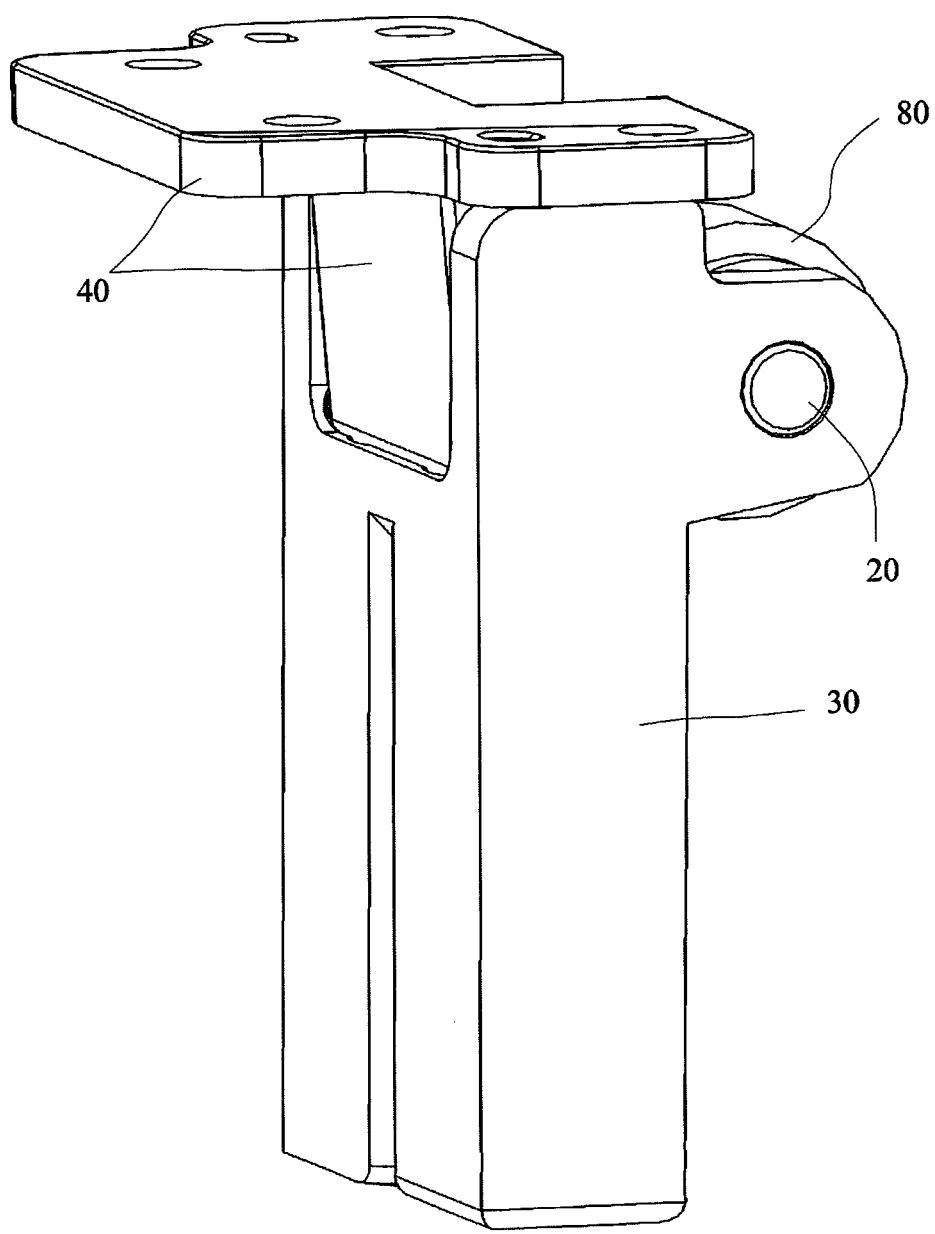
FIG. 8 is a pictorial view of the hinge of FIG. 2 when the cover is in a closed state.
Figure 9:
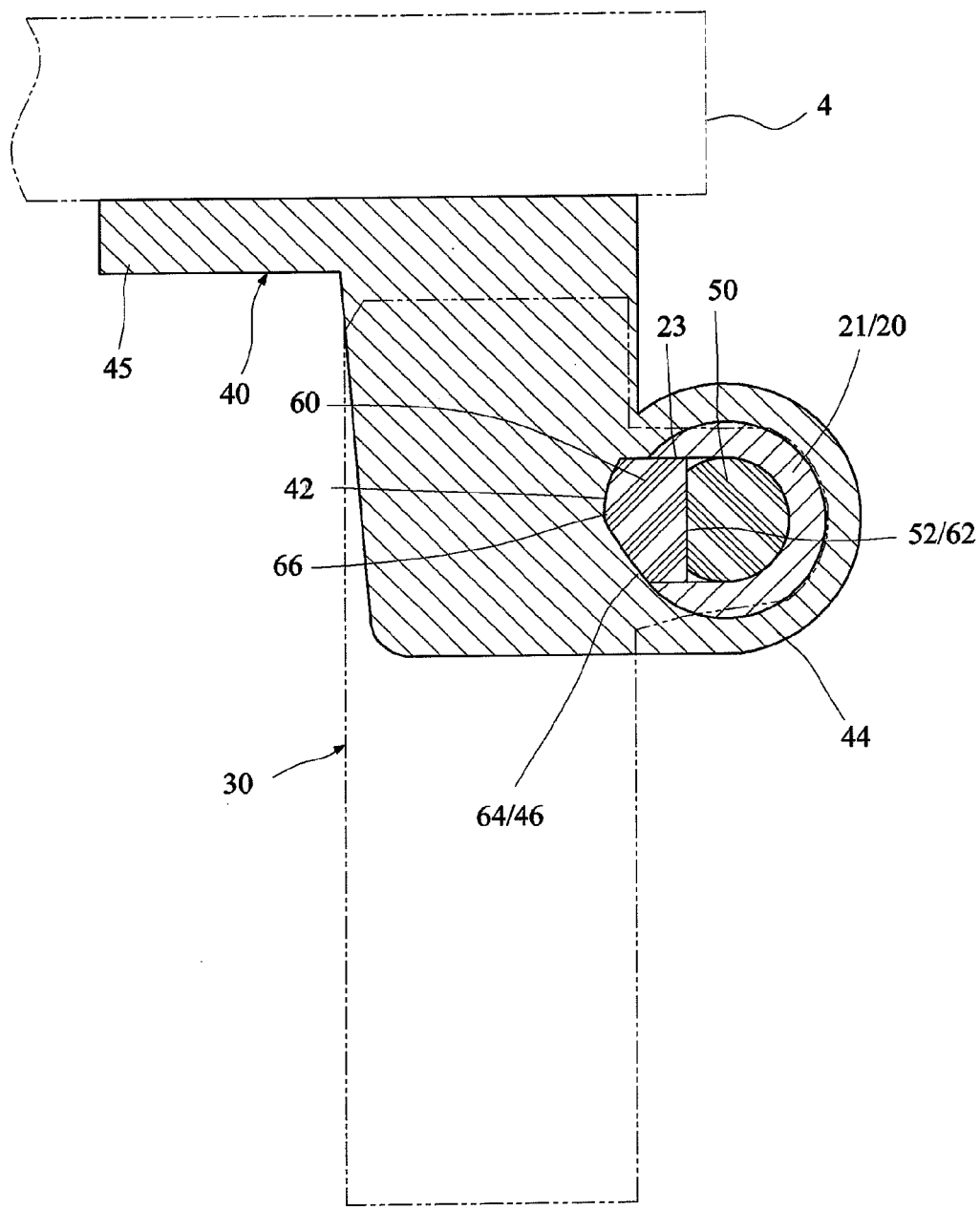
FIG. 9 is a schematic illustration of the hinge of FIG. 2 when the cover is in the closed state.

FIG. 7 is a schematic illustration of the hinge 10 of FIG. 2 when the cover 4 is ready to enter the automatically closing state. As shown in FIGS. 7 and 6, when the user presses the cover 4 down to a position corresponding to a closing angle from the base 1, a pivot angle of the second body 40 in relation to the first body 30 is equal to the predefined angle Ap. At this moment, the receiving cavity 42 advances, as the rotary sleeve 44 rotates, to a position partially facing the opening 23, such that the radial moving member 60 is no longer constrained by an annular wall 44W of the rotary sleeve 44, as it was in FIG. 5, and free to move. The radial moving member 60 comes to contact a wall of the receiving cavity 42. The energy storing member 70 starts to release the energy for driving the axial moving member 50 to make a reverse axial movement NAD. During the reverse axial movement NAD, the axial moving member 50 pushes the radial moving member 60 to make an outward radial movement NRD. In turn, the radial moving member 60 drives the second body 40 to pivot forward (see the arrow of FIG. 7) and thereby closes the cover 4 upon the platen 2 completely, as shown in FIGS. 8 to 10. Specifically speaking, during the outward radial movement NRD, the radial moving member 60 projects outwardly from the fixed shaft 20 and exerts a force upon a contact surface 46 of the receiving cavity 42 and drives the second body 40 to pivot forward in relation to the first body 30 until the radial moving member 60 is engaged with the receiving cavity 42.

As shown in FIGS. 6 and 7, the implemented radial moving member 60 has a convex portion 66 formed by an inclined outer surface 64. During the outward radial movement NRD, the convex portion 66 of the radial moving member 60 exerts the force upon the contact surface 46 of the receiving cavity 42 and drives the second body 40 to pivot forward in relation to the first body 30.

As shown in FIGS. 2, 6 and 7, the torque limiter 80 of the hinge 10 is sleeved on the fixed shaft 20, combined with the rotary sleeve 44 and rotatable with the rotary sleeve 44. When the pivot angle of the second body 40 in relation to the first body 30 is larger than the predefined angle Ap (e.g., the predefined angle Ap is equal to 10 degrees, and the pivot angle of the second body 40 in relation to the first body 30 is equal to 20 degrees), the torque limiter 80 provides a torque to hold the second body 40 at this pivot angle (20 degrees), which supports the second body 40 to remain stationary. Thus, the cover 4 of FIG. 1 would not close upon the platen 2 by its own weight if the cover 4 is opened to a certain position, where the user can place the document or take the document away without worrying about the cover 4 dropping down.

FIG. 8 is a pictorial view of the hinge 10 of FIG. 2 when the cover 4 is in a closed state. FIG. 9 is a schematic illustration of the hinge 10 of FIG. 2 when the cover 4 is in the closed state. FIG. 10 is a partial cross-sectional view of the hinge 10 of FIG. 2 when the cover 4 is in the closed state. As shown in FIG. 1 and FIGS. 8 to 10, when the cover 4 is closed upon the platen 2, the convex portion 66 is engaged and interlocked with the receiving cavity 42, and the inclined outer surface 64 of the convex portion 66 and the contact surface 46 of the receiving cavity 42 are in contact with each other. When the cover 4 is lifted up, the inward radial movement PRD of the radial moving member 60 again enables the energy storing member 70 to store the energy. In addition, the chamber 22 is formed with a bottom wall 22S which can constrain the movement of the axial moving member 50.

Figure 11:
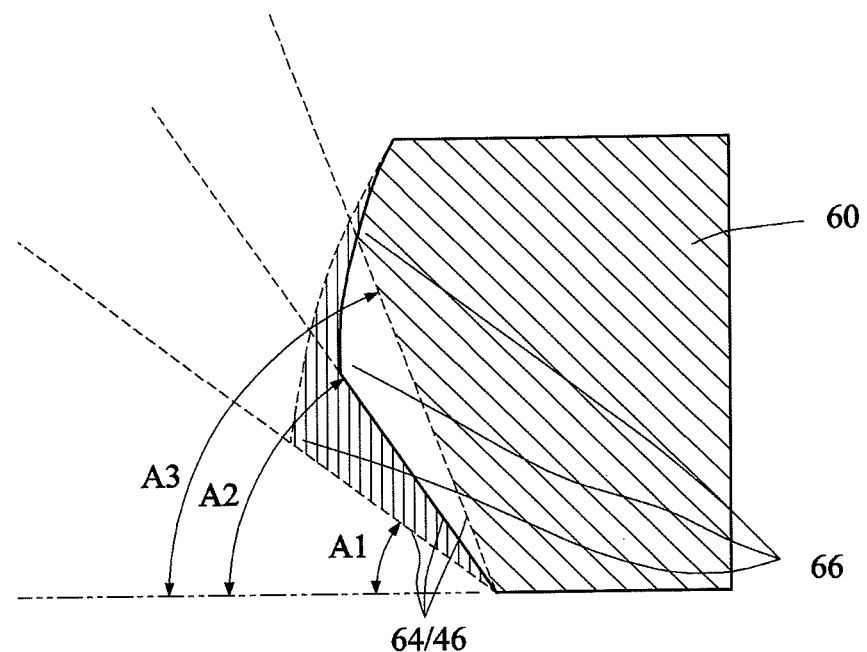
FIGS. 11 and 12 show relationships of the angle of the inclined outer surface of the radial moving member versus the automatically closing angle.
Figure 12:
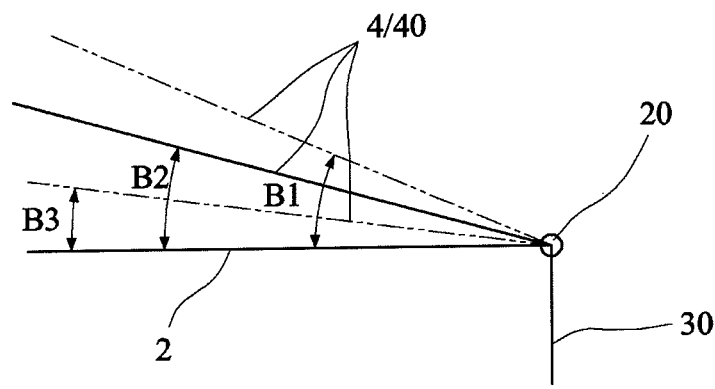

FIGS. 11 and 12 show relationships of the angle of the inclined outer surface 64 of the radial moving member 60 versus the automatically closing angle. As shown in FIGS. 11 and 12, the automatically closing angle can be easily controlled by changing the tilt angle of the inclined outer surface 64 of the radial moving member 60 and the sliding stroke between the radial moving member 60 and the receiving cavity 42. When the tilt angle of the inclined outer surface 64 is larger (e.g., angle A3), the automatically closing angle is smaller (e.g., angle B3); and when the tilt angle of the inclined outer surface 64 is smaller (e.g., angle A1), the automatically closing angle is larger (e.g., angle B1). Thus, the automatically closing angle B2 of FIG. 12 corresponds to the tilt angle A2 of the inclined outer surface 64 of FIG. 11; the automatically closing angle B1 of FIG. 12 corresponds to the tilt angle A1 of the inclined outer surface 64 of FIG. 11; and the automatically closing angle B3 of FIG. 12 corresponds to the tilt angle A3 of the inclined outer surface 64 of FIG. 11. The shapes of the receiving cavity 42 and its contact surface 46 should be changed according to the tile angle of the inclined outer surface 64 of the radial moving member 60, so that the receiving cavity 42 and the radial moving member 60 have the matched profiles.

In the present invention, the hinge and the electronic device require no friction plate, so that the cost can be reduced and the angle of the second body in relation to the first body can be effectively and precisely controlled. Because the torque limiters can provide several specifications of torque and can precisely control the orientation of the second body of the hinge, the designer can choose the torque limiter according to the product specification in a modularized manner, and the application of the hinge becomes more versatile. In addition, utilizing the inclined-surface slider mechanism composed of the axial moving member and the radial moving member in conjunction with the energy storing member makes the hinge have the automatically closing function. Also, the starting angle of automatically closing the cover can be changed by simply changing the angle of the inclined outer surface and the movement stroke of the radial moving member.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. An automatically closing hinge, comprising:
    a fixed shaft;
    a first body mounted on the fixed shaft;
    a second body pivotable with respect to the first body and comprising a rotary sleeve rotatably mounted on the fixed shaft, the rotary sleeve having a receiving cavity;
    an axial moving member disposed inside the fixed shaft and movable in an axial direction of the fixed shaft;
    a radial moving member disposed adjacent to the axial moving member inside the fixed shaft and movable in a radial direction of the fixed shaft, wherein the second body pivoting rearward in relation to the first body enables an inward radial movement of the radial moving member, and during the inward radial movement the radial moving member pushes the axial moving member and causes a forward axial movement of the axial moving member; and
    an energy storing member disposed in the fixed shaft and configured to store energy during the forward axial movement of the axial moving member and to release energy for driving the axial moving member to make a reverse axial movement, wherein during the reverse axial movement the axial moving member pushes the radial moving member to make an outward radial movement;
    wherein the radial moving member during the outward radial movement drives the second body to pivot forward in relation to the first body.

2. The hinge according to claim 1, wherein the axial moving member has an inclined surface and the radial moving member has an inclined surface, wherein the inclined surfaces tightly rest against each other and are slidable relatively to each other, and the axial moving member and the radial moving member push each other through the inclined surfaces.

3. The hinge according to claim 1, wherein during the outward radial movement the radial moving member projects outwardly from the fixed shaft and exerts a force upon a wall of the receiving cavity and drives the second body to pivot forward in relation to the first body until the radial moving member is engaged with the receiving cavity.

4. The hinge according to claim 3, wherein the radial moving member has a convex portion formed by an inclined outer surface, and during the outward radial movement of the radial moving member the convex portion exerts the force upon the wall of the receiving cavity and drives the second body to pivot forward in relation to the first body.

5. The hinge according to claim 3, wherein when a pivot angle of the second body in relation to the first body is equal to a predefined angle, the radial moving member comes to contact the wall of the receiving cavity and exerts the force upon the wall to drive the second body to pivot forward in relation to the first body.

6. The hinge according to claim 5, further comprising:
a torque limiter sleeved on the fixed shaft and combined with the rotary sleeve, wherein the torque limiter rotates with the rotary sleeve, and when the pivot angle of the second body in relation to the first body is larger than the predefined angle, the torque limiter provides torque to hold the second body at the pivot angle.

7. The hinge according to claim 1, wherein the fixed shaft comprises:
a shaft body having a chamber and an opening interconnecting with each other, wherein the axial moving member, the radial moving member and the energy storing member are disposed in the chamber, and the radial moving member projects from and retracts into the chamber through the opening.

8. The hinge according to claim 1, wherein the fixed shaft is inserted into the first body through a first open end and a second open end of the first body.

9. The hinge according to claim 1, wherein the energy storing member comprises a spring.

10. An electronic device, comprising:
a base;
a cover; and
an automatically closing hinge pivotally connecting the cover and the base and comprising:
a fixed shaft;
a first body mounted on the fixed shaft;
a second body pivotable with respect to the first body and comprising a rotary sleeve rotatably mounted on the fixed shaft, the rotary sleeve having a receiving cavity;
an axial moving member disposed inside the fixed shaft and movable in an axial direction of the fixed shaft;
a radial moving member disposed adjacent to the axial moving member inside the fixed shaft and movable in a radial direction of the fixed shaft, wherein the second body pivoting rearward in relation to the first body enables an inward radial movement of the radial moving member, and during the inward radial movement the radial moving member pushes the axial moving member and causes a forward axial movement of the axial moving member; and
an energy storing member disposed in the fixed shaft and configured to store energy during the forward axial movement of the axial moving member and to release energy for driving the axial moving member to make a reverse axial movement, wherein during the reverse axial movement the axial moving member pushes the radial moving member to make an outward radial movement;
wherein the radial moving member during the outward radial movement drives the second body to pivot forward in relation to the first body.

11. The electronic device according to claim 10, wherein the axial moving member has an inclined surface and the radial moving member has an inclined surface, wherein the inclined surfaces tightly rest against each other and are slidable relatively to each other, and the axial moving member and the radial moving member push each other through the inclined surfaces.

12. The electronic device according to claim 10, wherein during the outward radial movement the radial moving member projects outwardly from the fixed shaft and exerts a force upon a wall of the receiving cavity and drives the second body to pivot forward in relation to the first body until the radial moving member is engaged with the receiving cavity.

13. The electronic device according to claim 12, wherein the radial moving member has a convex portion formed by an inclined outer surface, and during the outward radial movement of the radial moving member the convex portion exerts the force upon the wall of the receiving cavity and drives the second body to pivot forward in relation to the first body.

14. The electronic device according to claim 12, wherein when a pivot angle of the second body in relation to the first body is equal to a predefined angle, the radial moving member comes to contact the wall of the receiving cavity and exerts the force upon the wall to drive the second body to pivot forward in relation to the first body.

15. The electronic device according to claim 14, wherein the automatically closing hinge further comprises:
a torque limiter sleeved on the fixed shaft and combined with the rotary sleeve, wherein the torque limiter rotates with the rotary sleeve, and when the pivot angle of the second body in relation to the first body is larger than the predefined angle, the torque limiter provides torque to hold the second body at the pivot angle.

16. The electronic device according to claim 10, wherein the fixed shaft comprises:
a shaft body having a chamber and an opening interconnecting with each other, wherein the axial moving member, the radial moving member and the energy storing member are disposed in the chamber, and the radial moving member projects from and retracts into the chamber through the opening.

17. The electronic device according to claim 10, wherein the fixed shaft is inserted into the first body through a first open end and a second open end of the first body.

18. The electronic device according to claim 10, wherein the energy storing member comprises a spring.

19. The electronic device according to claim 10, wherein the cover is mounted on the second body, and the first body is mounted on the base.

20. The electronic device according to claim 10, further comprising a scanning module disposed in the base, wherein the scanning module scans a document placed on a platen of the base and pressed by the cover.

\* \* \* \* \*